United States Patent [19]
Kusakabe et al.

[11] Patent Number: 5,929,351
[45] Date of Patent: Jul. 27, 1999

[54] CO-SB BASED THERMOELECTRIC MATERIAL AND A METHOD OF PRODUCING THE SAME

[75] Inventors: Hiroki Kusakabe, Sakai; Hisaaki Gyoten, Shijonawate; Masuo Takigawa, Nara, all of Japan

[73] Assignee: Matsushita Electric Industrial Co., Ltd., Japan

[21] Appl. No.: 09/064,986

[22] Filed: Apr. 23, 1998

[30] Foreign Application Priority Data

Apr. 23, 1997 [JP] Japan ................................. 9-105878
Nov. 19, 1997 [JP] Japan ................................. 9-318193

[51] Int. Cl.⁶ ................................................. C22C 19/00
[52] U.S. Cl. ................................ 75/228; 75/246; 419/35; 136/201; 136/240
[58] Field of Search ................................ 136/201, 240; 75/228, 246; 419/35

[56] References Cited

U.S. PATENT DOCUMENTS 5,610,366  3/1997  Fleurial et al. ........................ 136/202

FOREIGN PATENT DOCUMENTS 0 797 259  9/1997  European Pat. Off. .
5-55640   3/1993  Japan .
8-186294  7/1996  Japan .
9-8364    1/1997  Japan .

*Primary Examiner*—Ngoclan Mai
*Attorney, Agent, or Firm*—Wenderoth, Lind & Ponack, L.L.P.

[57] ABSTRACT

The present invention relates to a thermoelectric material containing $CoSb_3$ compound for converting heat to electricity, and provides a p-type thermoelectric material of $CoSb_3$ having a high power factor by achieving high Seebeck coefficient consistently with high electric conductivity in a material of $CoSb_3$ system without causing increase in heat conductivity. By sintering $Co_{0.07}Pt_{0.03}Sb_3$ alloy powder using the spark plasma sintering technique, the material is densified, while growth of grains is restricted, so that a higher electric conductivity is achieved with a heat conductivity maintained in a low level, and the figure of merit as a heat-transfer material is improved. Also, by providing such heat insulating layer as an oxide intermediately in a grain boundary of a compound of $CoSb_3$ in a sintered body, the heat conductivity is reduced. Further, the Seebeck coefficient is increased by adding a rare earth metal to the thermoelectric material of $CoSb_3$, and allowing it to be precipitated in grain boundaries of the sintered body.

21 Claims, 9 Drawing Sheets

CO-SB BASED THERMOELECTRIC MATERIAL AND A METHOD OF PRODUCING THE SAME

FIELD OF THE INVENTION

The present invention relates to a thermoelectric material of Co-Sb system for directly converting heat to electricity by the Seebeck effect and a method of manufacturing the same.

BACKGROUND OF THE INVENTION

Conventionally, a thermoelectric material of $Bi_2Te_3$ is known well as a thermoelectric material that makes use of Seebeck effect and Peltier effect, and has been practically employed in some applications. Such material has been limitedly used at about a room temperature, because the operating temperature range thereof is very narrow. In contrast, a thermoelectric $CoSb_3$ based material has the characteristics that an electron or hole mobility is very high in an intermetallic $CoSb_3$ based compound presenting Skutterudite structure. It is expected that the material can provide a high thermoelectric conversion efficiency as well as a wide operating temperature range.

Generally, a property important of a thermoelectric material is evaluated by a figure of merit $Z=S^2\sigma/k$ using Seebeck coefficient S, an electric conductivity $\sigma$ and a heat conductivity k as parameters. In order to increase the figure of merit Z, it is required that S and $\sigma$ are higher, and k is lower.

Regarding a thermoelectric material of $CoSb_3$ in prior art, Japanese Patent Publication No. 8-186294A discloses that power factor $S^2\sigma$ is increased by adding Pd, Rh, Ru or the like to $CoSb_3$, and further points out that $S^2\sigma$ is increased in such material, because $\sigma$ is increased by densifying a sintered body. It is known that a similar effect can be also obtained by alternatively adding Pt.

Said Japanese Patent Publication No. 8-86294A, regarding techniques of manufacturing a sintered body for a thermoelectric material of $CoSb_3$ system, also discloses a method of sintering compacts of powders which are provided by grinding an ingot form ed by melting Co and Sb, and a method of further densifying the sintered body by hot pressing or HIP after the sintering process.

Although Pd and Pt added to a $CoSb_3$ based thermoelectric material increases $S^2\sigma$, it never causes significant reduction of the heat conductivity k. In order to further increase the figure of merit of the thermoelectric material of $CoSb_3$, there is still an issue of obtaining a lower heat conductivity. Although the electric conductivity $\sigma$ can be increased by densifying a sintered body, such sintering process of a long time as conventionally employed causes crystal grains to grow and coarsen. Since the coarsening of crystal grains simultaneously causes increase of the heat conductivity k, the figure of merit has never been increased so much.

In order to use such material for a thermoelectric module, it is required, in terms of the efficiency of power generation, to produce a p-n junction by using two type of materials, that is, p-type and n-type thermoelectric materials of $CoSb_3$. Addition of either Pd or Pt conventionally conducted represents an n-type thermoelectric material. Although a thermoelectric material of $CoSb_3$ with a low content of impurities comes to be of p-type itself, and has a high Seebeck effect, it is low in electric conductivity $\sigma$ and insufficient in the figure of merit.

Regarding a p-type thermoelectric material, any element substitutable for Co in $CoSb_3$ has not been discovered yet, and it is required to find out a appropriately substitutable element. It is generally considered that such element similar in atomic characteristics as transition metals of iron group, such as Mn, Cr, Fe represents a relatively easily substitutable element for Co.

However, substitution of such element for Co has rarely been achieved by such conventional method of alloying it into the $CoSb_3$ based material. Although addition of the transition metal as Mn, Cr and Fe increases a carrier density, and brings about increase of the electric conductivity $\sigma$, it tends to cause considerable reduction of the Seebeck coefficient S, hence reduction of the power factor $S^2\sigma$.

SUMMARY OF THE INVENTION

An object of the present invention is to provide a sintered body of $CoSb_3$ which brings about further increase of the figure of merit of a thermoelectric material of $CoSb_3$ and a method of manufacturing the same.

Another object of the present invention to find out means for increasing only the electric conductivity $\sigma$ without causing increase of the heat conductivity k of a sintered body of $CoSb_3$ and means for positively reducing the heat conductivity k without causing significant reduction of the electric conductivity s of a $CoSb_3$ based sintered body.

Another object of the present invention is to provide a $CoSb_3$ based sintered body containing the $CoSb_3$ compound of allowing substitution of a transition metal of iron group for a part of Co contained in $CoSb_3$, to increase the figure of merit of the thermoelectric device, and a method of producing the same.

In order to achieve the objects, the $CoSb_3$ based thermoelectric material of the invention is formed to a sintered body with high density by using spark plasma sintering method from powders of $CoSb_3$ compound which is mainly composed of Co and Sb.

A method of producing a thermoelectric material according to the invention has a characteristic of comprising a step of sintering powders of $CoSb_3$ compound to produce a sintered body with a high density by using spark plasma sintering method.

Spark plasma sintering method can provide a high densification in the sintered body during sintering for only a short period of time, as will be described later, and can increase the electric conductivity of the sintered body, allowing the figure of merit of thermoelectric device to be increased.

In spark plasma sintering, grains of a powdered compound of $CoSb_3$ may be maintained in the form of fine crystal grains without crystal growth in the sintered structure. Thus by finely regulating the grain size of a powdered compound of $CoSb_3$ beforehand as a raw material, the sintered body can be controlled to obtain fine-grained structure. An area of crystal grain boundary is increased in relation to a crystal grain size in a sintered body so that scattering of phonons in the grain boundary is enhanced, the heat conductivity is reduced, and the figure of merit as the thermoelectric material is increased.

In another aspect of the present invention, in order to positively reduce the heat conductivity k without causing significant reduction of the electric conductivity $\sigma$ of a sintered body of $CoSb_3$, the thermoelectric material of the invention has further characteristic in that heat insulating layers are provided intermediately in a part of crystal grain boundaries of the $CoSb_3$ based sintered body. Because the heat insulating layers are intermediately formed only in a part of the grain boundaries, the electric conductivity may be not significantly reduced in the sintered body as the most part of crystal grain boundaries are in direct contact, while the heat conductivity of the sintered body is relatively reduced by the heat insulating layer provided in the part of grain boundaries, and the figure of merit as a thermoelectric material of $CoSb_3$ can be increased.

The thermoelectric material with a heat insulating layer provided therein, a may be produced by methods of coating grains of powdered compound of $CoSb_3$ with an oxide film by oxidizing the their surface beforehand, and sintering a pressed compact of the powders later. In the sintered body obtained, the oxide film is located intermediately in a part of crystal grain boundary of the compound in the sintered body, forming a heat insulating layer.

In another aspect of the invention, the method of producing the thermoelectric material comprises steps of coating powders of a compound of $CoSb_3$ in a surface thereof with ceramic layers beforehand, and sintering formed compacts of the powders. In the sintered body obtained in this manner, the ceramic layers is maintained in a part of the crystal grain boundaries of the sintered body, and provides heat insulating layers on the crystal grains. In the producing methods, the powders of the compound coated with an oxide film or ceramic layer are preferably sintered by using the spark plasma sintering technique.

In another aspect, the present invention provides a p-type thermoelectric material of $CoSb_3$ which is a sintered body containing crystal grains of the $CoSb_3$ compound and rare earth elements precipitated in grain boundaries thereof and then a high Seebeck coefficient may be maintained in the $CoSb_3$ compound, while the electric conductivity can be increased by the rare earth metal particles distributed in the grain boundary layers, even although it should be a p-type thermoelectric material.

Particularly, in a thermoelectric material of $CoSb_3$ of the present invention, a p-type thermoelectric material is formed by adding 0.1 to 1.7 mol % of a rare earth metal Ln with respect to 100 mol % of a $CoSb_3$ compound. The content of rare earth metal Ln should be controlled to be at 1.7 mol % or less, because as it exceeds 1.7 mol % the Seebeck coefficient presents a negative value, and the thermoelectric material comes to be of n-type.

Preferably, a thermoelectric material of $CoSb_3$ according to the present invention may include a sintered body containing the rare earth metals which are distributed in crystal grain boundaries of the $CoSb_3$ based sintered body, and substituted by transition metals M such as Fe, Ru and Mn for a part of Co in the $CoSb_3$ compound.

Specifically, a thermoelectric material of $CoSb_3$ according to the invention may have a composition of $Co_{1-x}M_xSb_3$ with a part of Co in the crystal phase of $CoSb_3$ substituted for by any transition metal M of Fe, Ru and Mn, where x is 0.05 or less, and contains a rare earth metal Ln. In this case as well, the rare earth metal Ln of 0.1 to 1.7 mol % should be contained with respect to 100 mol % of the $Co_{1-x}M_xSb_3$ compound.

Although substitution of such transition metal M as Fe, Ru and Mn is effective for increasing the electric conductivity, while it also causes reduction of the Seebeck coefficient, as such Seebeck coefficient is compensated by addition of the rare earth metal Ln, the power factor $S^2\sigma$ of an entirety of sintered body can be increased as a result.

More preferably, a thermoelectric material of $CoSb_3$, according to the invention includes a sintered body comprising a first crystal phase which is $CoSb_3$ phase forming a main part of the body and a second crystal phase of $Co_{1-x}M_xSb_3$ (where x is between 0.01 and 0.03) formed by substituting transition metals M such as Fe, Ru or Mn for a part of Co in the $CoSb_3$ phase.

In the thermoelectric material of such two-phase type, the main phase serves for maintaining a high Seebeck coefficient, and the second phase of $Co_{1-x}M_xSb_3$ substituted of the transition metal M serves for increasing the electric conductivity, allowing the entire sintered body to increase in figure of merit. The thermoelectric material is controlled such that a content of the first phase comes to be in a range of 60 to 70 wt % in the material to maximize the power factor $S^2\sigma$.

BRIEF DESCRIPTION OF THE DRAWINGS

The invention is described in detail below with reference to the accompanying drawings, in which.

BEST MODE OF CARRYING OUT THE INVENTION

According to the invention, a sintered body is formed of $CoSb_3$ based compound, wherein the $CoSb_3$ based compound includes a wide range of compounds that present a crystalline structure of Skutterudite type which is mainly composed of $CoSb_3$ and its compound with other metallic elements added thereto, particularly those with a part of Co in a $CoSb_3$ compound substituted for by other elements. For example, it may be a compound with a part of Co substituted for by such transition element as Pt and Pd as a substitutive element composing $Co_{0.97}Pt_{0.03}Sb_3$, for instance.

also, a compound formed by adding such rare earth metal as La and Ce added to $CoSb_3$ my be also used, to reduce the heat conductivity of a sintered body may be also employed.

Various methods may be used for preparation of a powdery compound of $CoSb_3$ providing a raw material to be sintered. Particularly, there may be used a method of melting a raw material that contains Co and Sb to solidify an ingot, homogenizing it during heat treatment to allow a compound of $CoSb_3$ to be uniformly precipitated in the solid, and breaking the ingot to mill to powder into predetermined grain size.

For example, such method is to weigh Co, Sb and other metals specified above to make a compound of above-described composition, and melt them in a melting furnace in a non-oxidative, particularly, inactive atmosphere, then and solidify the melt to solid, holding the ingot at a precipitation temperature (600 to 860° C.) below a initial precipitating temperature (approximately 876° C.) of the intermetallic compound of $CoSb_3$ in the same furnace. In the process the compound of $CoSb_3$ is completely precipitated in the ingot, and homogenization is achieved. The solid ingot cooled after homogenization is ground to powder which is classified into a desired grain size distribution as a powdery material for sintering.

In a first aspect of the invention, spark plasma sintering technique is employed for sintering the powder of the intermetallic compound of $CoSb_3$ to produce a thermoelectric material. In the sintering technique, in sum, a pre-compact of the powder is charged a hollow in a cylindrical graphite mold and compressing it between two graphite plugs which are inserted through a hollow of the cylindrical mold from both ends thereof, while in a vacuum atmosphere a pulse current is applied between both the graphite plugs in order to generate sparks among powdery grains of the compact in the hollow, the spark heating the compact and promoting a sintering process to obtain a sintered body in a short period of time.

Figure 1:
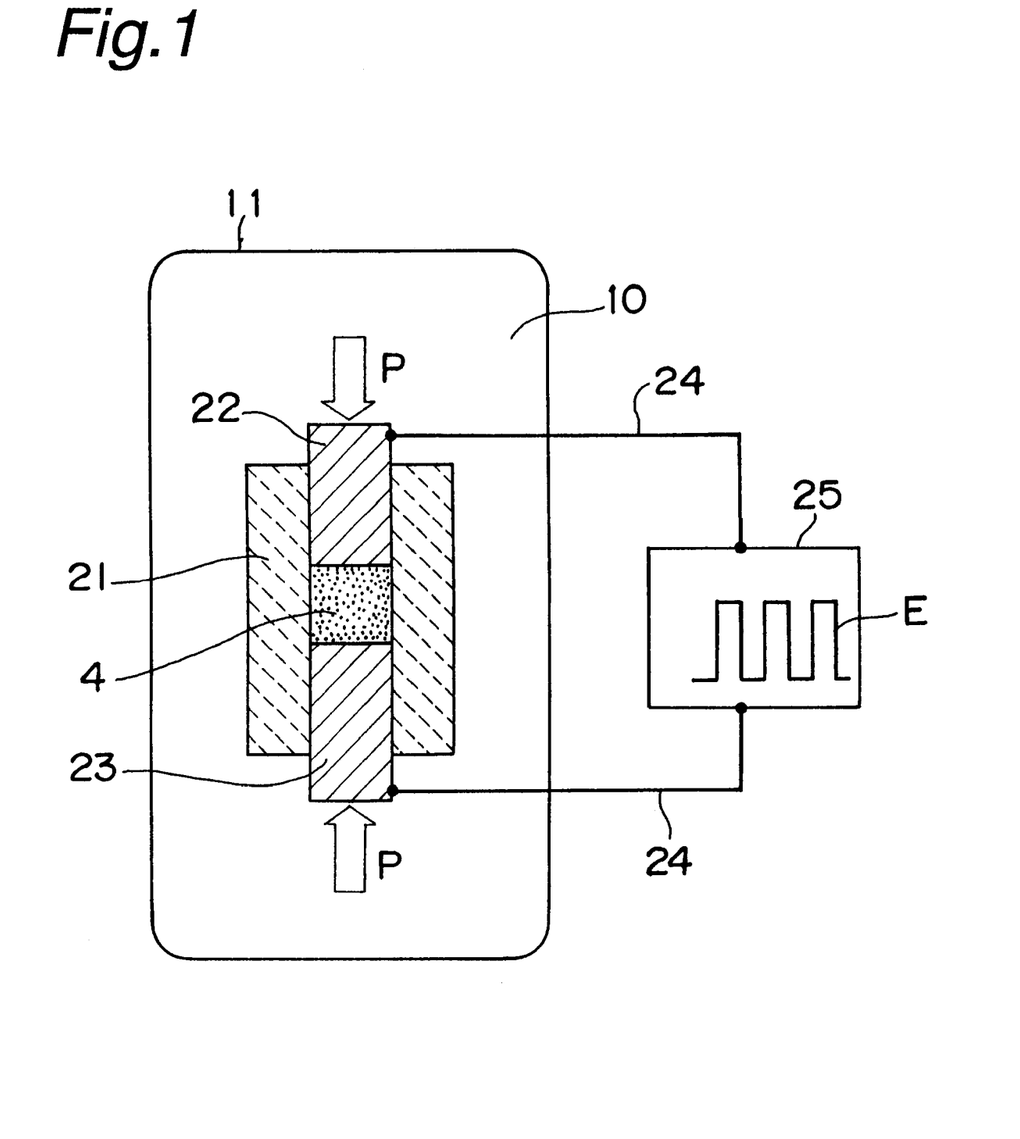
FIG. 1 shows a schematically sectional view of spark plasma sintering apparatus to be used in an embodiment of the invention.

A schematic sectional view of such spark plasma sintering apparatus is shown in FIG. 1, where a subject 4 to be sintered, in this case, a powder of compound of $CoSb_3$ or its pressed compact is charged in a cylindrical graphite mold 21 housed inside a vacuum chamber 11, two graphite plugs 22 and 23 are inserted in the mold 21 through the opposite openings of the mold 21, and arranged such that the subject 4 may be compressed between both the end surfaces of the plugs, the graphite plugs 22 and 23 which are connected with pressing means (not shown) at the other ends thereof, and a electric pulse power supply 25 for heating purpose is connected between the graphite plugs 22 and 23. In sintering, the chamber 20 is kept in vacuum in the inside, the graphite plugs 22 and 23 are pressed against the subject 4 by the pressing means, while a cyclic pulse voltage E is applied between the graphite plugs 22 and 23. An electric current heats the graphite plugs 22 and 23 and cylindrical graphite mold 21 as it flows therethrough, and the subject 4 is rapidly heated at the same time as it is simultaneously compressed by the force of the press, thus, sintering is achieved.

In the spark plasma sintering process, because the $CoSb_3$ based compound is electrically conductive, a part of the current applied also flows through the subject (the pressed compact) 4 in the cylindrical graphite mold 21 in a pulsatory manner, so that spark is caused in the vicinity of a surface contact point between grains of the $CoSb_3$ based compound in the subject 4, and they are fusion-joined to each other at the contact point due to Joule heat and a heat generated locally by discharge energy.

Then, as the pulse current is continuously applied to the compact under the pressure of the press, fusion-joining is caused between the grains at arc points that are dispersive and transient, and the grains heated in such condition are compressed to increase a contact area in the surface of grains and densify the compound in a short time to form a sintered body.

In the case of the hot pressing and HIP processes conventionally employed, since it takes a long time to sinter a compound of $CoSb_3$ to make a dense sintered body, and growth of crystal grains in the compound is, therefore, caused during the sintering process, even if the subject to be sintered is in the form of fine powders, a sintered body of high density and fine crystal grains has never been achieved.

In the invention, owing to the spark plasma sintering technique, a sintering process for obtaining a dense sintered body is completed in a very short period of time of, for example, about 3 to 10 min, dependently on dimensions of a subject to be sintered, and growth of crystal grains can be almost completely prevented. Thus, the sintered body obtained as a result maintains a dense structure, and there is practically no crystal grain that is grown coarsely. It means that a crystal grain size of sintered body can be easily controlled by controlling a grain size of powdery compound of $CoSb_3$ system before sintering.

A crystal grain size in a sintered body obtained by molding is preferably at 200 $\mu$m or less, more preferably at 100 $\mu$m or less, most preferably at 10 $\mu$m or less. Provision of fine crystal grains is effective in reducing the heat conductivity of the sintered body. According to the invention, such crystal grain size can be easily obtained by adjusting a grain size of powdery compound to the crystal grain size beforehand. Preferably, the grain size of powder should be at 100 $\mu$m or less, and a crystal grain size of sintered body should be at 100 $\mu$m or less after sintering.

On the other hand, a relative density of sintered body should be at 98% or more. In such manner, the electric conductivity of sintered body can be increased, and the figure of merit of sintered body as a thermoelectric device is higher.

Embodiment 1

An embodiment according to an aspect of the invention is described below. Metallic materials of Co (at a purity of 99.9985%), Sb (purity of 99.9999%) and Pt (at a purity of 99.9%) weighed to make a composition ratio of $Co_{0.97}Pt_{0.03}Sb_3$ after sintering were melted by heating and hold them at a melting temperature of 1100 to 1200° C. in a crucible inside an electric furnace under an Ar atmosphere for 2 hrs. Then, the molten pool in the crucible was heated and maintained below a precipitation temperature (876° C.) of $CoSb_3$ at 850° C. for 10 hrs., and a Skutterudite-type crystal structure was obtained by solid phase diffusion. A solid mass obtained was roughly ground in a mortar, then to fine particles of a mean grain size of 100 μm or less by a planetary ball mill. In such manner, single-phase powder of a compound of $CoSb_3$ were obtained.

The powder was preliminarily pressed into a compact in a desired shape, placed between a pair of graphite plugs provided for compression in a graphite cylinder of a spark plasma sintering apparatus, and compressed by applying a compressive force of 500 kgf/cm² between the graphite plugs with a vacuum chamber 11 maintained in a vacuum condition in the inside, while a pulse current was applied between the graphite plugs. The compact was rapidly heated to a temperature of 700° C. after application of the current, maintained in the condition for about 4 min for sintering, and cooled immediately thereafter. Thus, a dense sintered body of 98% or more in relative density was obtained. The pulse current was supplied at a voltage several V and a peak current of about 2000 A to an inner diameter of 20 mm of the graphite cylinder in the spark plasma sintering apparatus.

Figure 2:
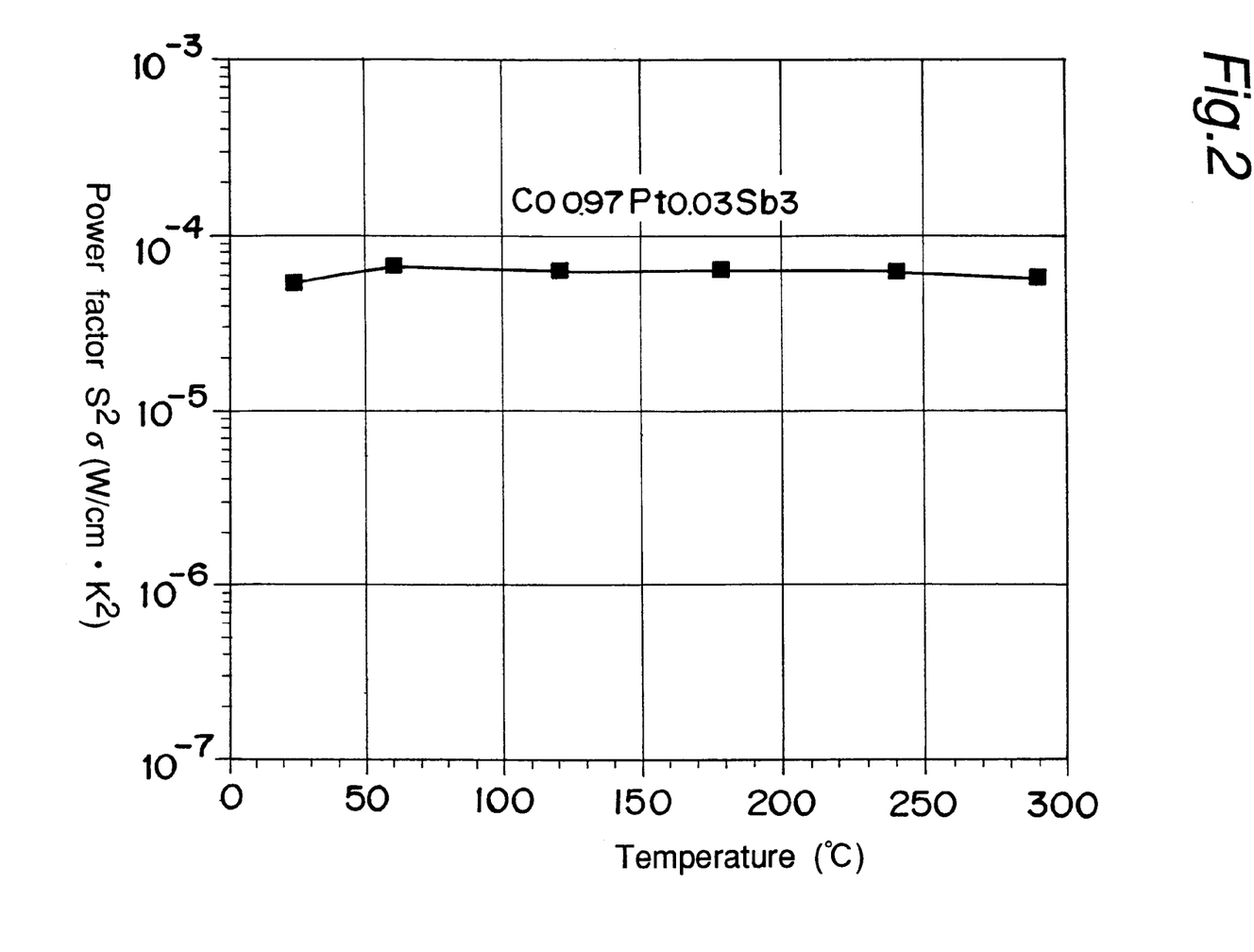
FIG. 2 is a graph showing a relation between the power factor and temperature of a sintered body of $Co_{0.97}Pt_{0.03}Sb_3$ according to an embodiment of the invention.

The power factor $S^2\sigma$ of the sintered body of the $Co_{0.97}Pt_{0.03}Sb_3$ composition obtained in such manner is shown in FIG. 2, where the power factor exceeds $6\times10^{-5}$ W/cmK², which is achieved to a higher value than three times the conventional value ($2\times10^{-5}$ W/cm²) of a sintered body obtained by hot press.

Figure 3:
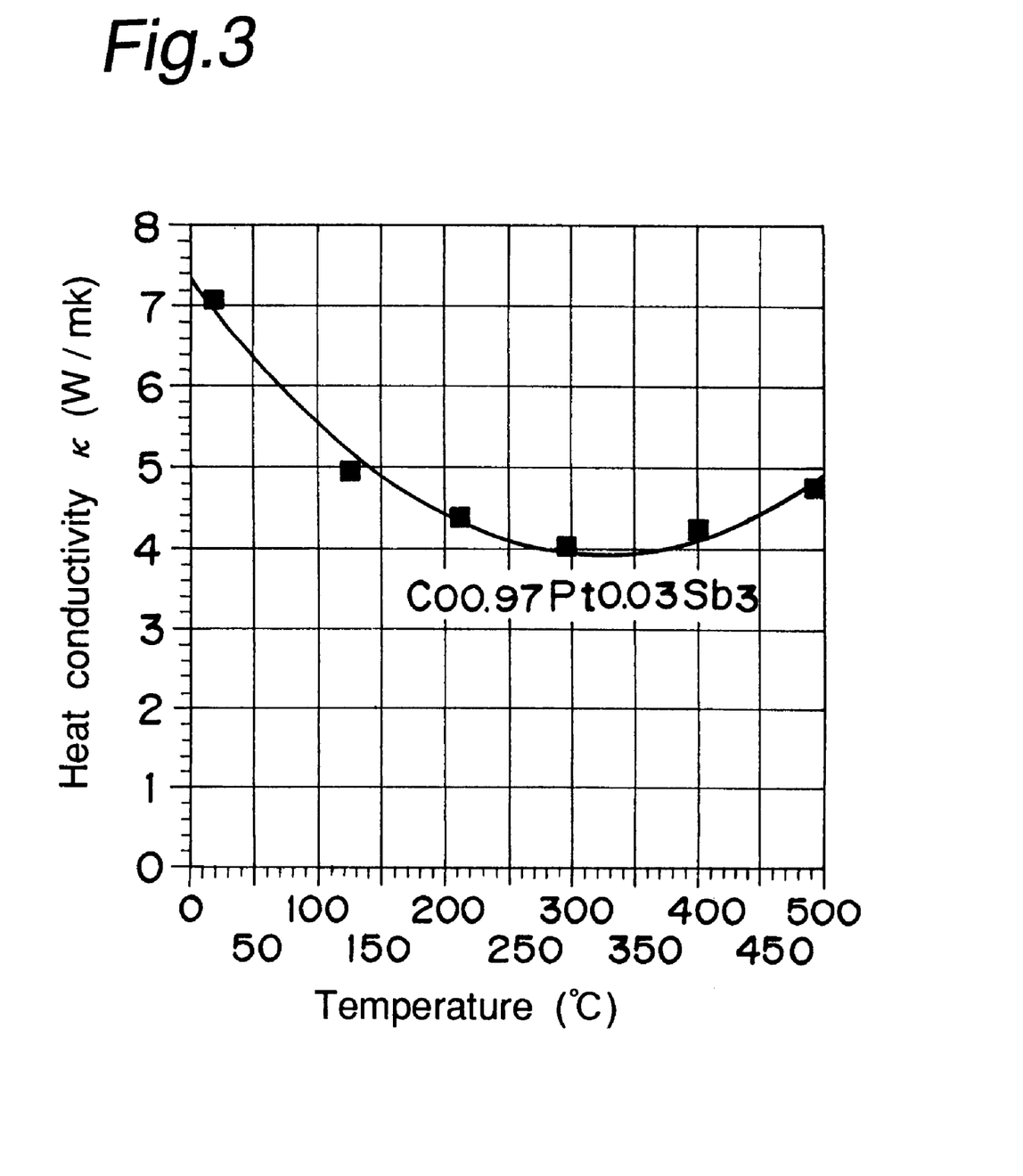
FIG. 3 is a graph showing a relation between the heat conductivity k and temperature of a sintered body of $Co_{0.97}Pt_{0.03}Sb_3$ according to an embodiment of the invention.

In FIG. 3, a change in heat conductivity k of the material by the spark plasma sintering is shown in relation to temperature. The heat conductivity k is not increased regardless of the higher density as a result of the spark plasma sintering which is characterized by a short time of sintering process effective for preventing grain growth, and demonstrates the lowest value of 4 W/mK (at 300° C.).

Figure 4:
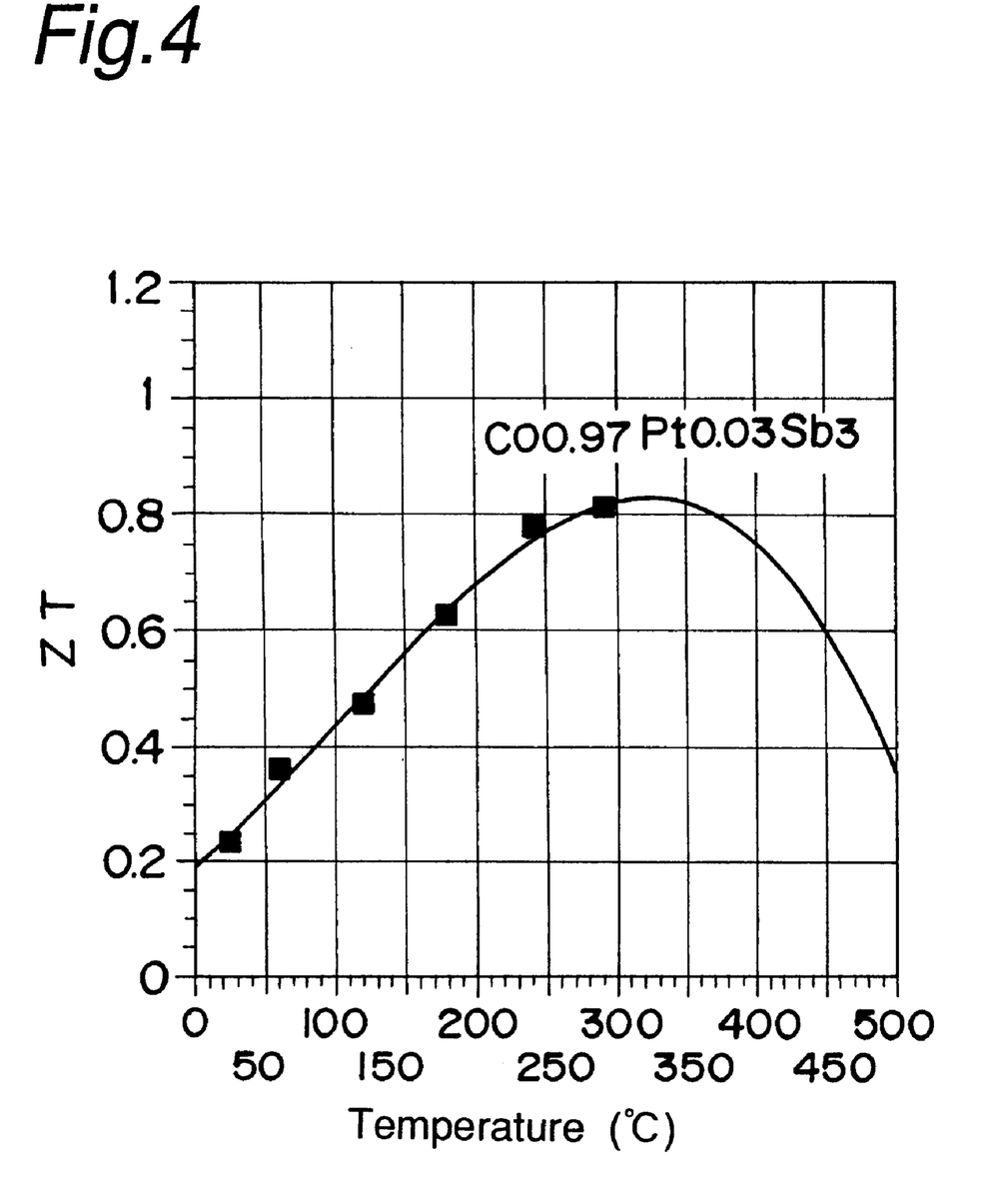
FIG. 4 is a graph showing a relation between the non-dimensional figure of merit ZT and temperature of a sintered body of $Co_{0.97}Pt_{0.03}Sb_3$ according to an embodiment of the invention.

The non-dimensional figure of merit ZT calculated from the data is shown in FIG. 4, where ZT=0.8 at about 300° C., and a value of the figure of merit sufficient for practical application is obtained in a medium temperature range of around 300° C.

Figure 5A:
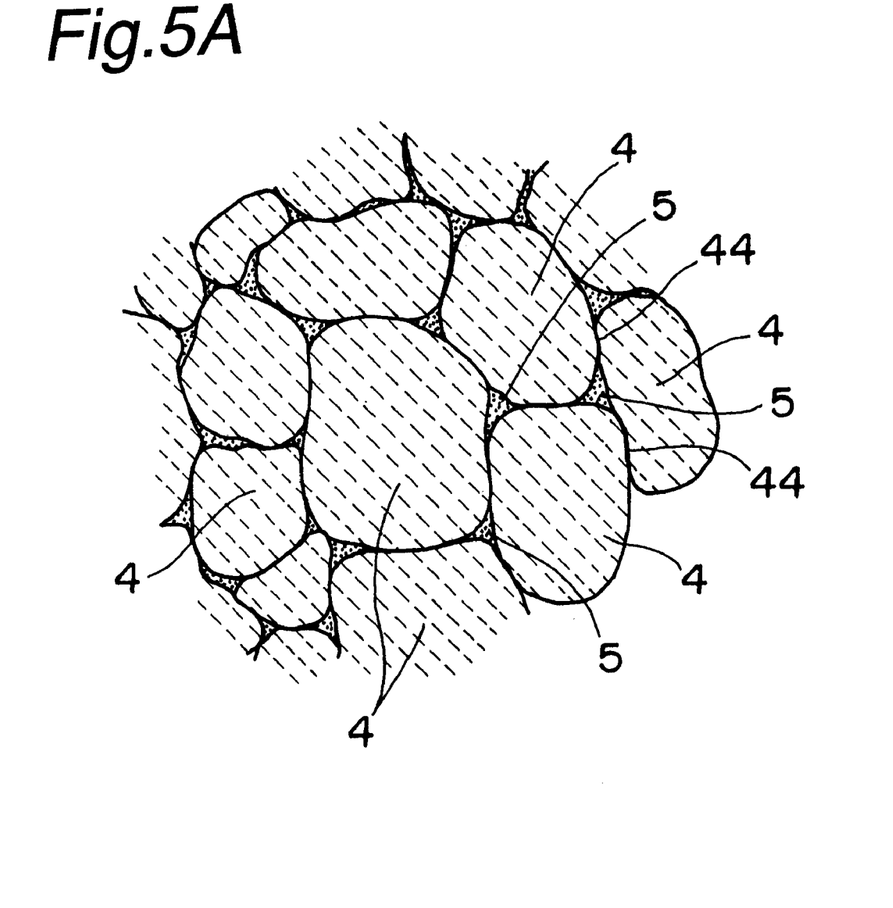
FIG. 5A is a schematic sectional view showing the structure of a sintered body with heat insulating layers provided in crystal grain boundaries thereof.

According to another aspect of the invention, by providing a heat insulating layer in a part of crystal grain boundaries of a sintered body, a thermoelectric material of $CoSb_3$ is reduced in heat conductivity without causing significant reduction in electric conductivity. In FIG. 5A, a schematic view of a crystalline structure of sintered body is shown, where the sintered body is constituted by a portion forming a grain boundary 44 between crystal grains 4 and 4 that are in contact with each other and a heat insulating layer 5 located intermediately between the grains.

such heat insulating layer 5 can be obtained by using either oxide films formed by surface oxidization of the powdery compound of $CoSb_3$ or ceramic layers separately formed in surfaces of the powdery compound of $CoSb_3$.

In the case of oxide films, the powdery compound may be heated in an oxidative atmosphere, for example, the air to form coating films including layers of an oxide of the compound $CoSb_3$, mainly, an Sb oxide on surfaces of the particles o the powder. Such oxide films are maintained as they are in a part of crystal grain boundaries in a sintered body during sintering the compact powder, and provides heat insulating layers.

Alternatively, in the case of the ceramic layers, the powdery compound of $CoSb_3$ system is formed with ceramic layers in surfaces thereof, and the ceramic layers are maintained as they are in a part of crystal grain boundaries in the sintered body during sintering the compact powder to provide heat insulating layers.

Figure 5B:
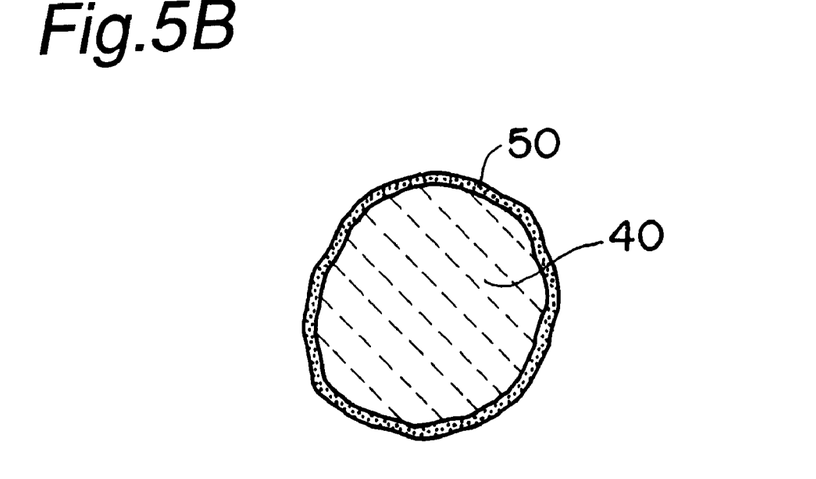
FIG. 5B is a schematic sectional view of grains of a powdery $CoSb_3$ compound with ceramic layers formed in intersurface thereof.

In FIG. 5B, a ceramic layer 50 formed in the surface of a powdery compound 40 of $CoSb_3$ is schematically shown. the example of the ceramic layers include silica, alumina, titania and zirconia, and such nitride as aluminum nitride and titan nitride may also be employed. Such oxides and/or nitrides can be provided by vapor deposition onto surfaces of the powdery compound of $CoSb_3$ using sputtering or other methods.

In the powdery compound of $CoSb_3$ formed with the oxide films or ceramic layers, the grains of the powder are fused to each other at many contact points among them, as the surfaces thereof are activated by spark discharge between the grains during the spark plasma sintering, even though the oxide films or ceramic layers are present, and further connected to each other by a compressive force to form grain boundaries, where the oxide films or ceramic layers fill up spacings between the grains at the final stage of the sintering process, thus forming the heat insulating layers of oxide films or ceramic layers.

In this way, as shown in FIG. 5A, although the heat insulating layer 5 serves for reducing the heat conductivity between the grains by heat insulation, the electric conductivity is not reduced so much as the heat conductivity is, because the grains are directly in contact with each other in the most part of crystal grain boundaries 44, and the figure of merit can be accordingly increased as a whole.

In another aspect, a thermoelectric material according to the invention comprises a sintered body containing a compound of $CoSb_3$ which contains Co and Sb with a rare earth metal Ln of small amount added thereto. The rare earth metal Ln is preferably selected from lantanoids, specifically, La, Ce, Nd, Sm and Gd. the content of the rare earth metal Ln should be at 0.1 to 1.7 mol % in relation to 100 mol % of the compound of $CoSb_3$.

The thermoelectric material after sintering is structured by a crystal phase of the compound of $CoSb_3$ and precipitated particles of the rear earth metal Ln precipitated in a crystal grain boundaries thereof. Most of the rare earth metal is precipitated and distributed in the crystal grain boundaries in a clustered or particulate state, because either substitution or solution thereof in the crystallized compound of $CoSb_3$ is insignificant. Such distribution of rare earth metal is preferable in increasing the Seebeck coefficient.

A thermoelectric material according to a fourth aspect of the invention comprises a sintered body of $CoSb_3$ system mainly composed of Co and Sb, wherein a part of Co in the $CoSb_3$ crystal phase is substituted for by any transition metal M of Fe, Ru and Mn to present a composition of $Co_{1-x}M_xSb_3$ where x is 0.05 or less and a rare earth metal Ln is contained therein. The sintered body comprises a $Co_{1-x}M_xSb_3$ crystal phase and precipitated phase of the rare earth metal Ln precipitated and distributed in a crystal grain boundaries.

A method for sintering the thermoelectric materials comprising steps of press-forming homogeneous fine powder to a compact, which comprises a compound of a predetermined composition expressed by formula $CoSb_3$ or $Co_{1-x}M_xSb_3$ and the rare earth metal Ln, and sintering the pressed compact by firing it at a high temperature may be employed.

Alternatively, a method of mixing fine powders of compounds of a predetermined composition each is expressed by a composition formula of $CoSb_3$ or $Co_{1-x}M_xSb_3$ with powder of the rare earth metal Ln, press-forming the mixed powders to a compact, and sintering it by firing may be employed.

A mean crystal grain size of the $CoSb_3$ crystal phase or $Co_{1-x}M_xSb_3$ crystal phase in the sintered body should be as fine as 100 μm or less, and a higher effect can be obtained by further reducing a mean grain size, because an area of grain boundaries is increased. The Seebeck coefficient is increased as the grains are reduced to 20 μm or less in size. Specifically, the grain size should be within a range of 1 to 10 μm in order to increase the Seebeck coefficient. If it is less than 1 μm, however, the electric conductivity of sintered body is reduced. It is not preferable to preliminarily grind the raw material for a long time to reduce the size of crystal grains, because a composition of the crystallized compound of $CoSb_3$ may be changed due to entrance of foreign substances and generation of frictional heat.

In order to provide the sintered body with fine-grained structure of 20 μm or less in crystal grain size, preferably, the particle size of the fine powder before sintering is prepared to a predetermined value of 20 μm or less, and such sintering method is employed causing no growth of the grains of the structure in sintering. As such sintering method, in particular, the spark plasma sintering technique is preferably employed in the invention, since time required for a sintering process can be shorter, and a sintered body can be provided with high density, as described above.

According to another aspect of the invention, a thermoelectric material comprises a sintered body of two-phase type, comprising a first crystal phase which is formed by a thermoelectric material of $CoSb_3$ containing Co and Sb with a rare earth element Ln added thereto to provide crystal grains of $CoSb_3$ composition with the rare earth element Ln contained therein, and a second phase which is formed by substituting any transition metal M of Fe, Ru and Mn for a part of Co to provide crystal grains of $Co_{1-x}M_xSb_3$ compound (where x is 0.05 or less, particularly in a range of 0.001 to 0.03) containing the transition metal M. In the sintered body, the crystal grains of these two phases being intermixed with each other.

In the sintered body of two-phase type, the crystal grains of the first phase and those of the second phase are formed from homogenous powders that are formulated separately from each other, and such method of press-forming a mixture of the fine powders of the two kind to a compact, and firing the compact at a high temperature for sintering may be employed.

Regarding the mixture of powdery alloys, it is particularly preferable that mixing and pulverization are simultaneously achieved by using a planetary ball mill. It is advantageous for subsequently connecting the crystal grains by sintering, because the crystal grains of the first phase and those of the second phase are brought into contact or connected with each other during the mixing and pulverization process.

For the fine powders of $CoSb_3$ containing a rear earth metal Ln or $Co_{1-x}M_xSb_3$ of above-described composition, such melting method is preferably employed in order to obtain a homogenous composition.

Specifically, for producing the powders, raw metals is melted in a crucible inside an electric furnace, a $CoSb_3$ phase is precipitated in an ingot by heat retention including a cooling process after the melting operation, and a thermoelectric material is produced through subsequent processes of grinding and pulverization of the ingot.

In the melting process, the raw metals of high purity of Co and Sb and the specified rare earth metal Ln as well as the transition metal M, if required, are melted at a temperature of 1000 to 1100° C. in a crucible inside an electric furnace under a non-oxidative atmosphere so that a composition intended is obtained, then the molten pool in the crucible is heated and maintained at about 850° C., that is, below upper precipitation temperature (876° C.) of $CoSb_3$ for 2 to 10 hrs. in the electric furnace. By maintaining it at such constant temperature, precipitation of such other intermediate phase as CoSb and $CoSb_2$ is minimized, so that the amount of $CoSb_3$ crystals having Skutterudite structure in the ingot can be maximized.

In the grinding process, the ingot obtained is roughly ground after it is self-cooled, and further pulverized to a mean grain size of 100 μm or less, preferably, by using a planetary ball mill or the like, for example, and fine powders to be sintered are obtained by controlling the grain size within the specified range described above.

In the melting process, it is preferable that the rare earth metal Ln is alloyed with Sb beforehand, and added in the form of an LnSb compound, because the rare earth metal Ln is particularly easily oxidized, and a yield into a molten metal may be low.

A part of Sb is apt to be evaporated during the melting process, since the melting point of Sb is at 630.8° C., and a vapor pressure is high at above-described melting temperature. Then, it is desired to predict a amount of sb lost by such evaporation, and increase the amount of Sb of 2 to 5% by weight beforehand.

In carrying out the invention, the spark plasma sintering method is preferably adopted in the sintering process, as described above. The fine powders prepared by the melting method as already described are preliminarily pressformed to a compact. The compact is placed between a pair of graphite plugs provided for compression within a graphite cylinder in a spark plasma sintering apparatus, and a vacuum chamber is maintained in a vacuum condition. Then, the compact is compressed by applying a pressure of 500 kgf/cm² between the graphite plugs, while a pulse current is supplied between the graphite plugs. The compact inside the graphite cylinder is rapidly heated to such temperature that sintering between the grains are easily achieved, for example, about 700° C. after the current is supplied, and maintained in that condition for as short a time as 2 to 10 min before completion of the sintering process. In such manner, a dense sintered body of 90% or more in relative density can be obtained. Such method is advantageous in that a sintered body of high density can be obtained without causing coarsening of crystal grains because of a short time of sintering operation.

Embodiments according to the aspects above are completely described below.

Embodiment 2

Metal Co (purity of 99.9985%) and Sb (purity of 99.9999%) and La (at a purity of 99.9%) as the rare earth metal Ln were formulated to make a $CoSb_3$ composition with 1 mol % of La contained therein, and melted by heating them at a melting temperature of 1100 to 1200° C. in a crucible inside an electric furnace under an Ar atmosphere, and maintaining in the condition for 2 hrs. Then, the molten metal in the crucible was heated and held in the crucible at 850° C. for 10 hrs. in the electric furnace, and cooled thereafter. The ingot obtained was pulverized to a mean grain size of 100 μm or less by a planetary ball mill after it was subjected to rough grinding. In such manner, fine powders of an alloyed thermoelectric material of $CoSb_3$ were obtained.

The powder was preliminarily press-formed into a compact, and placed between a pair of graphite plugs provided for compression in a graphite cylinder of a spark plasma sintering apparatus, then compressed in a vacuum condition by applying a pressure of 500 kgf/cm² between the graphite plugs, while a pulse current was applied between the graphite plugs. The pulse current supplied was at a voltage of several V and a peak current value of 2000 A with respect to an inner diameter of 20 mm of the graphite cylinder. The compact was rapidly heated to a temperature of 700° C. after application of the current, and held in the condition for as short a time as about 4 min for sintering. Thus, a dense sintered body of 90% or more in relative density was obtained.

Figure 6:
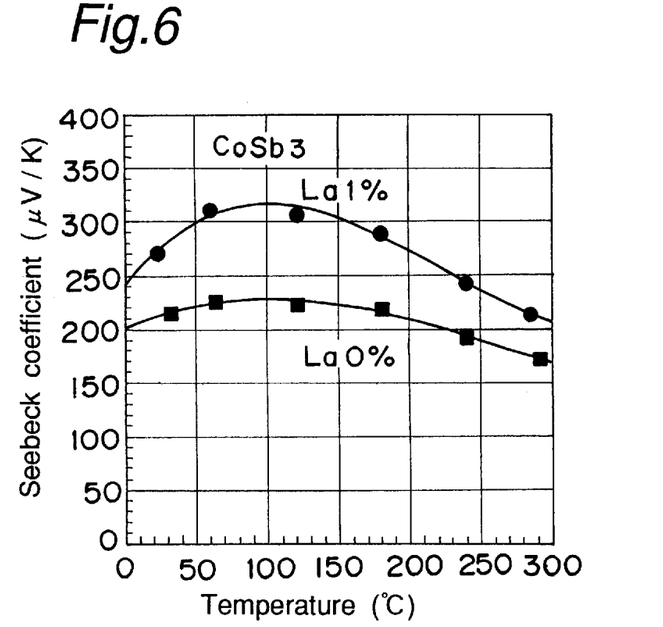
FIG. 6 is a graph showing a relation between the Seebeck coefficient and measuring temperature for a sintered body of $CoSb_3$ compound containing 1 mol % of La according to the invention.

The Seebeck coefficient ($\mu$V/K) actually measured for the sintered body obtained in such manner of $CoSb_3$ composition with 1 mol % of La contained therein is shown in relation to temperature in FIG. 6. Data of a sintered body of $CoSb_3$ compound formed without adding any rare earth element is also shown as an compared example, and it should be noted that the Seebeck coefficient is significantly increased in the embodiment, and the highest value exceeds 300 $\mu$V/K. It is considered that metallic La contained was precipitated in the form of fine particles in the grain boundaries of $CoSb_3$ crystal phase, and scattering of carriers was thereby enhanced.

Embodiment 3

Figure 7:
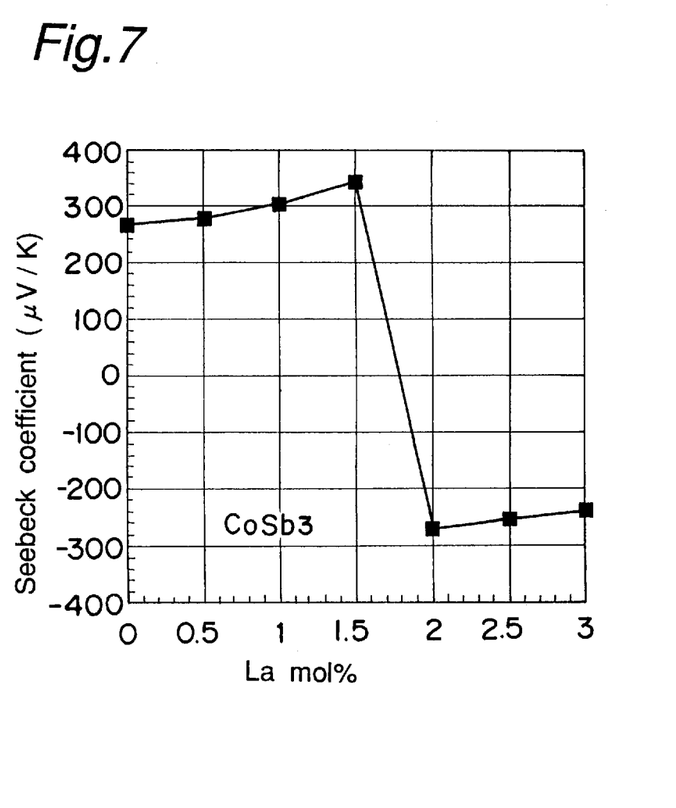
FIG. 7 is a graph showing a relation between the content of La and Seebeck coefficient in a sintered body of $CoSb_3$ compound according to the invention.

A sintered compound was prepared in a similar manner as that of Embodiment 1 by selecting La as the rare earth metal Ln, and changing the content of La within a range of 0 to 3 mol %. A relation between the content of La and the Seebeck coefficient of sintered body is shown in FIG. 7, and it is recognized that the Seebeck coefficient of sintered body turns to be a negative value as the content of La exceeds 1.7 mol %.

According to a result of observation of a polished section of sintered body by using an EPMA, although most of the content of La is probably distributed and retained in a crystal grain boundaries in a particulate form, when the content of La is 1.7 mol % or less, and the $CoSb_3$ crystals of a sintered body provides a p-type semiconductor. It may be observed that La in a number of particles of metal La precipitated in a grain boundary is diffused and migrates or is solved into a $CoSb_3$ crystal phase, as the content of La exceeds 1.7 mol %, and it is, therefore, considered that the crystal phase was changed to an n-type semiconductor as La in the crystal grain acted as an electron donor. In other words, in order to obtain a p-type thermoelectric material of $CoSb_3$ system by adding La, it is recognized that the content of La is required to be at 1.7% or less. A similar result is obtained with such other rare earth element as Ce, Nd, Sm and Gd.

Embodiment 4

Raw materials of Co and Sb similar to those of Embodiment 1 and LaSb (purity of 99.9%), an alloy of La and Sb, as an alternative source of Ln were formulated to make $CoSb_3$ composition, and melted by heating them at a melting temperature of 1100 to 1200° C. in a crucible inside an electric furnace under an Ar atmosphere, and maintaining in that condition for 2 hrs.

In this embodiment, LaSb was synthetically produced by using a method of melting and alloying. By alloying the rare earth metal and Sb, a loss caused in the oxidization-sensitive metal due to oxidization during such process as mixing and heat treatment can be prevented.

Then, similarly to Embodiment 2, in order to obtain a crystalline structure of skutterudite type, the molten pool was retained in the crucible, and heated and maintained at 850° C. for 10 hrs. as in the case of Embodiment 1, and an ingot obtained was pulverized to a mean grain size of 100 $\mu$m or less by a planetary ball mill after it was subjected to rough grinding. Thus, powders of an alloyed thermoelectric material of $CoSb_3$ system were obtained.

The powders were treated in a manner similar to that of Embodiment 1, and a dense sintered body of 90% or more in relative density was obtained by using the spark plasma sintering method. Conditions of a spark plasma sintering process were identical with those for Embodiment 2.

Figure 8:
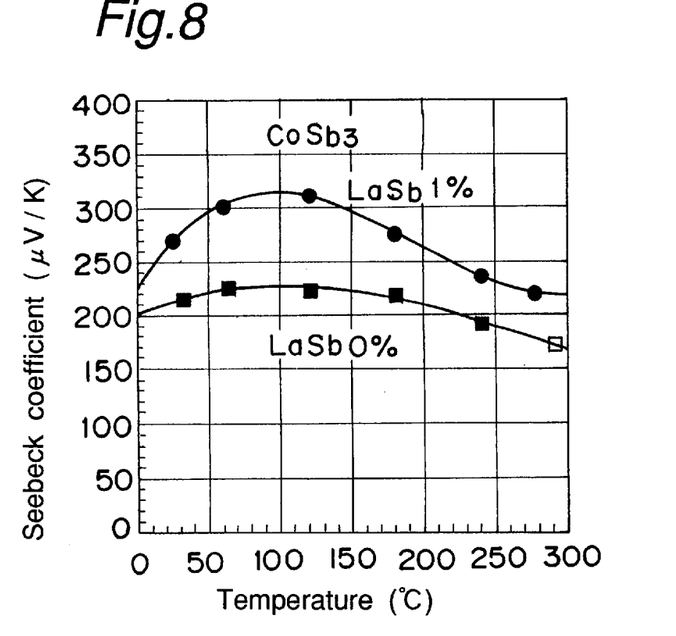
FIG. 8 is a graph showing a relation between the Seebeck coefficient and temperature of a sintered body of $CoSb_3$ compound according to an embodiment of the invention.

The Seebeck coefficient of the sintered body obtained in such manner is shown in relation to a measuring temperature in FIG. 8. The Seebeck coefficient is significantly increased from that of a sintered body of $CoSb_3$ compound shown as a comparison example. It is improved in comparison with that of the sintered compact of Embodiment 1, although the improvement is only slight. The way of adding La in the form of an LaSb alloy is also applicable to such other rare earth metal as Ce, Nd, Sm and Gd, and a similar result is obtained.

Embodiment 5

In a thermoelectric material of the invention, raw materials of metals Co (purity of 99.9985%), Sb (purity of 99.9999%), La (purity of 99.9%) as the rare earth metal Ln and Fe (purity of 99.9%) as the substitutive transition metal M were formulated to make a composition of $Co_{0.997}Fe_{0.003}Sb_3$, and melted them at a melting temperature of 1100 to 1200° C. in a crucible of an electric furnace under an Ar atmosphere for 2 hrs. Then, in order to obtain Skutterudite crystalline structure in the process of solidification and subsequent solid phase diffusion, the molten metal in the crucible was heated and held at 850° C. for 10 hrs., and cooled thereafter in the crucible. The ingot obtained was subjected to rough grinding, then powders thereof were pulverized to a mean particle size of 100 $\mu$m or less by a planetary ball mill. The powders were preliminarily press-formed in a manner similar to that of Embodiment 1, and sintered by using a spark plasma sintering apparatus, and a dense sintered body of 90% or more in relative density was obtained.

Figure 9:
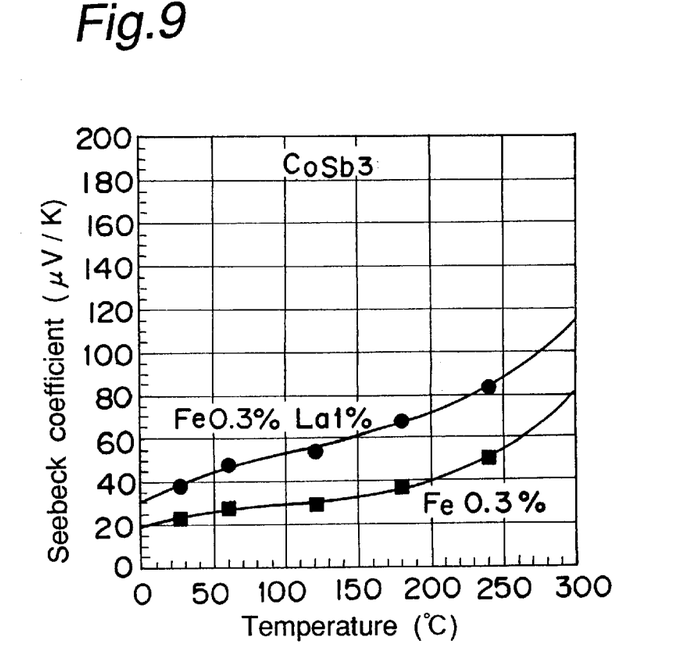
FIG. 9 is a graph showing a relation between the Seebeck coefficient and temperature for a sintered body of $Co_{0.997}Fe_{0.003}Sb_3$ compound containing 1 mol % of La according to an embodiment of the invention.

The Seebeck coefficient of the sintered body obtained in such manner of $CoSb_3$ system with Fe and La contained therein is shown in FIG. 9. It is recognized in the figure that the Seebeck coefficient is relatively low in a conventional sintered body of $CoSb_3$ compound with Co substituted for only by Fe in comparison with a sintered body without substitution by Fe (compare with data of La 0% in FIG. 11; the electric conductivity (not shown) is, however, higher on the contrary). On the contrary, the Seebeck coefficient is increased in the sintered body of $CoSb_3$ with 1 mol % of La also contained in the presence of Fe therein according to the embodiment. It is considered to be because the hole scattering effect is enhanced by La grains present in the grain boundaries.

Also, a similar effect was obtained by using such transition metal as Ru and Mn in place of Fe and such rare earth element as Ce, Nd, Sm and Gd in place of La.

Embodiment 6

According to the fifth mode, a thermoelectric material of two-phase type comprise a first phase which is formed by adding 1 mol % of Sm to a $CoSb_3$ compound to provide $CoSb_3$ composition with 1 mol % of Sm contained therein and a second phase which is formed by substitution of Fe to provide $Co_{0.997}Fe_{0.003}Sb_3$ composition was produced by using Fe as the transition metal M and Sm as the rare earth metal Ln.

First, by using Sm (purity of 99.9%) in addition to metal Co, Sb and Fe at high purity similar to those of Embodiment 2 as raw materials, two types of alloys, one composed of $CoSb_3$ with 1 mol % of Sm contained therein and the other composed of $Co_{0.997}Fe_{0.003}Sb_3$ by substitution of Fe, were individually produced, respectively, by melting the materials in a crucible inside an electric furnace in a manner similar to that of Embodiment 1. Fine powders of said two compositions of 100 μm or less in grain size were prepared, respectively, by pulverizing an ingot that was maintained at a high temperature.

The two types of powdery alloys were mixed with each other in such manner that the compounding ratio by weight between the fine powders of $CoSb_3$ containing 1 mol % of Sm and fine powders of the Fe-substitution product ($Co_{0.997}Fe_{0.003}Sb_3$) comes to be at 10:0, 7:3, 5:5 and 0:10, and further mixed and ground by a planetary ball mill to obtain four kinds of powdery mixtures. Each of the powdery mixtures obtained was subjected to preliminary pressforming, then the pressed compact obtained was placed between a pair of graphite plugs provided for compression in a cylinder of spark plasma sintering apparatus in a manner similar to that of Embodiment 1, and compressed by applying a pressure of 500 kgf/cm$^2$ between the graphite plugs with a vacuum chamber maintained in a vacuum condition, while a pulse current at a voltage of several V and a maximum current value of about 2000 A was applied to the graphite plugs. After application of the current, the molding was rapidly heated to a temperature of 700° C., and maintained in that condition for 4 min for sintering. In such manner, a dense sintered body of 90% or more in relative density was obtained. The spark plasma sintering method was conducted in a manner similar to that employed in Embodiment 1

Figure 10:
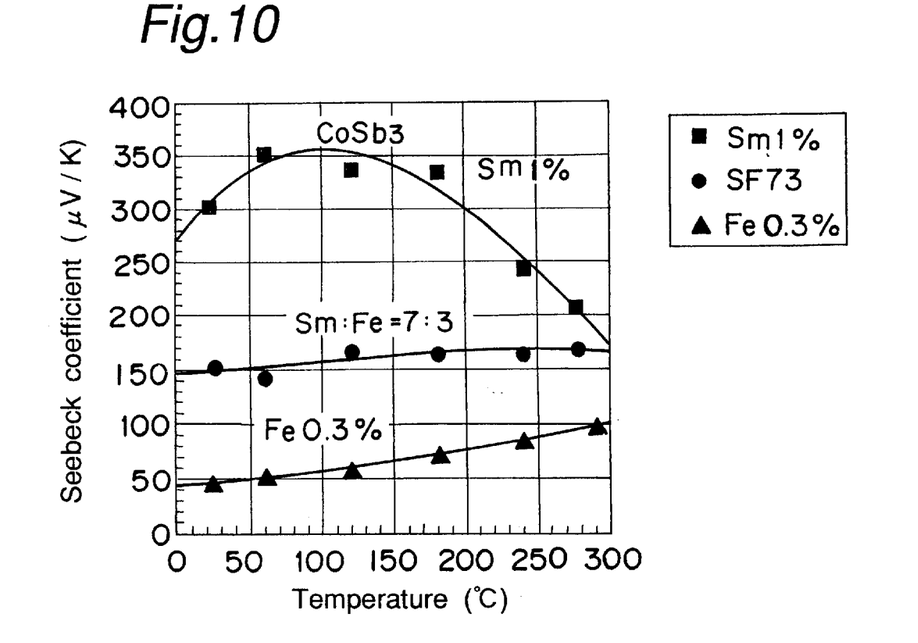
FIG. 10 is a graph showing a relation between the Seebeck coefficient and temperature of a sintered body of mixed fine powders of $Co_{0.997}Fe_{0.003}Sb_3$ compound and $CoSb_3$ compound containing 1 mol % of Sm according to a fourth embodiment of the invention.
Figure 11:
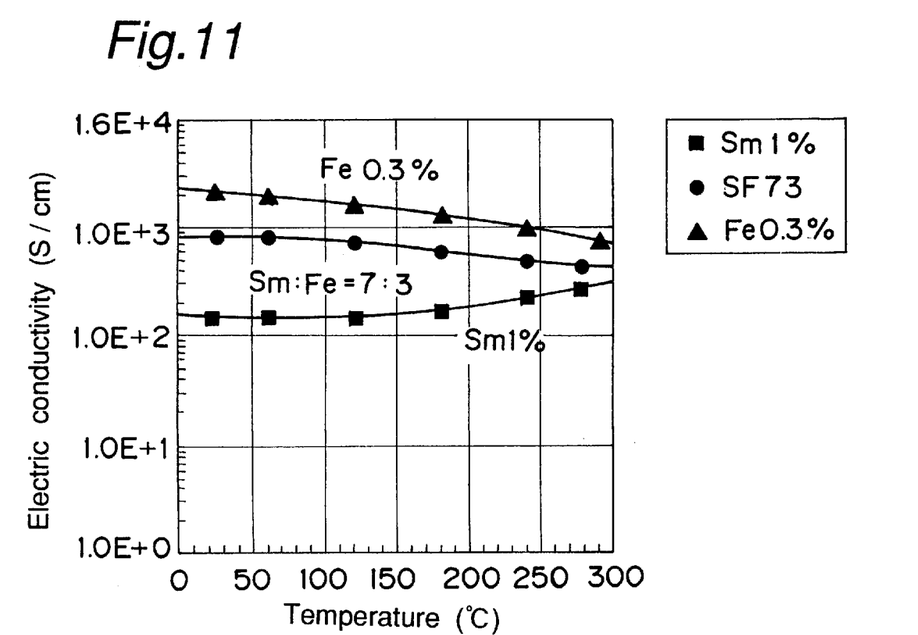
FIG. 11 is a graph showing a relation between the electric conductivity and temperature of a sintered body of $Co_{0.997}Fe_{0.003}Sb_3$ compound mixed with $CoSb_3$ compound containing 1 mol % of Sm according to an embodiment of the invention; and, FIG. 12 is a graph showing a relation between the power factor and mixing ratio of a sintered body of $Co_{0.997}Fe_{0.003}Sb_3$ compound mixed with $CoSb_3$ compound containing 1 mol % of Sm according to an embodiment of the invention.

The Seebeck coefficient of a composite sintered material of 7:3 in the mixing ratio between the $CoSb_3$ compound containing Sm and $Co_{0.997}Fe_{0.003}Sb_3$ compound is shown in FIG. 10, and the electric conductivity in FIG. 11. It is recognized that the composite sintered body demonstrates the Seebeck coefficient intermediately located between those of the sintered body of $CoSb_3$ system containing Sm alone and the sintered body of $CoSb_3$ compound with substitution of Fe alone in FIG. 10 and the electric conductivity also intermediately located between them in FIG. 11.

Figure 12:
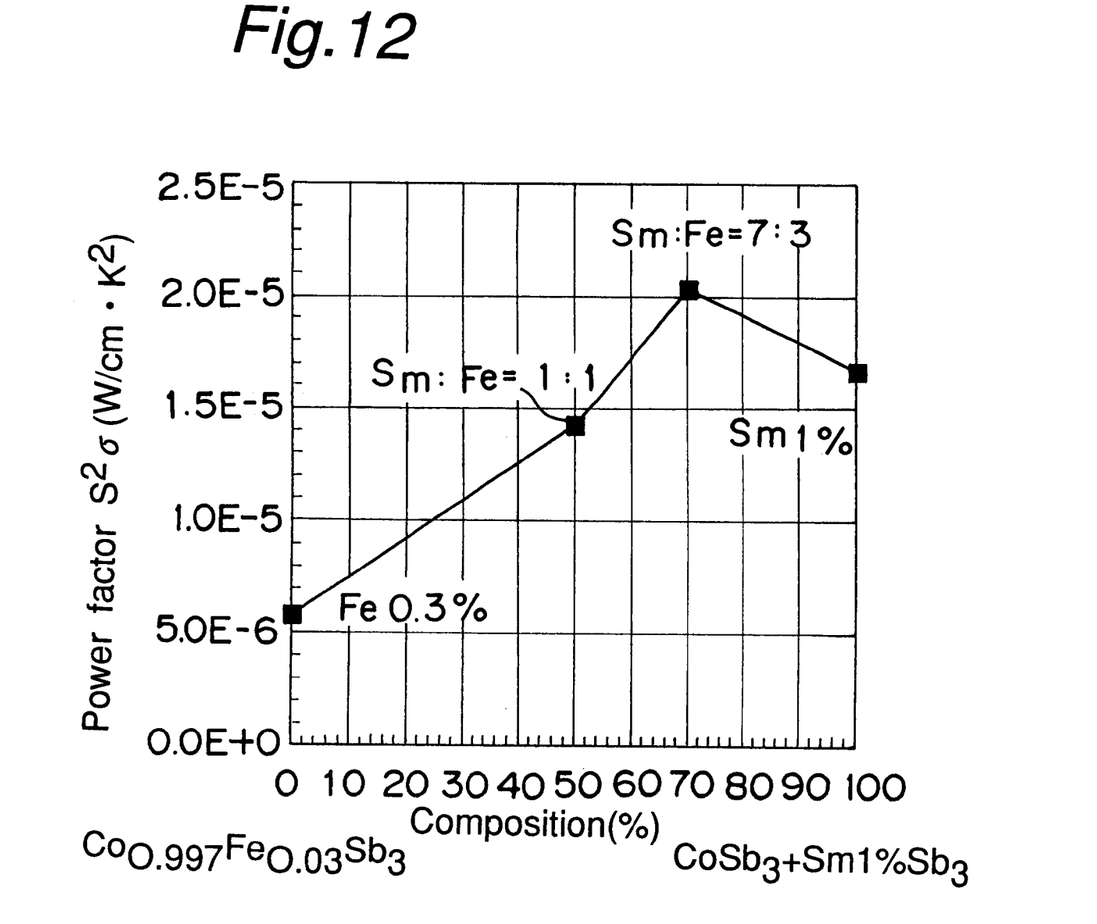

In FIG. 12, a relation between the mixing ratio and the power factor at 120° C. of the composite sintered body is shown, where the sintered body prepared by mixing the fine powders of $CoSb_3$ containing Sm and those of Fe substitution product ($Co_{0.997}Fe_{0.003}Sb_3$) in the ratio of 7:3 is higher in power factor in comparison with the sintered body of $CoSb_3$ containing Sm alone. Thus, by mixing the powdery alloys of two types described above, the Seebeck coefficient and electric conductivity come to be consistent with each other. Although the power factor of sintered body of 1:1 in the mixing ratio is also shown in the figure, because the Seebeck coefficient is low in such case, the power factor exceeding that of the sintered body of $CoSb_3$ containing Sm alone cannot be achieved.

A similar effect was obtained by using such transition metal as Ru and Mn alternatively to Fe and such rare earth element as La, Ce, Nd, Sm and Gd alternatively to Sm.

We claim:

1. A $CoSb_3$ based thermoelectric material which contains Co and Sb, comprising a sintered body formed by sintering powder of the compound of $CoSb_3$, wherein in the sintered body a part of crystal grain boundaries of the compound of $CoSb_3$ are provided with heat insulating layers.

2. The $CoSb_3$ based thermoelectric material according to claim 1, wherein the powder is coated with oxide films by surface oxidization and the heat insulating layer is provided by the oxide films retained in the part of crystal grain boundaries of the compound of $CoSb_3$ in the sintered body.

3. The $CoSb_3$ based thermoelectric material according to claim 1, wherein the powder is coated with a ceramic layer in a surface thereof, and the heat insulating layer is provided by the ceramic layer retained in the part of crystal grain boundary of the compound of $CoSb_3$.

4. The $CoSb_3$ based thermoelectric material according to claim 2 or 3 wherein the sintered body is sintered using spark plasma sintering technique.

5. The $CoSb_3$ based thermoelectric material which contains Co and Sb, comprising a sintered body formed by sintering powder of a compound of $CoSb_3$, wherein the sintered body contains one or more rare earth metals of 0.1 to 1.7 mol % as a rare earth element with respect to 100 mol % of the $CoSb_3$ compound.

6. The $CoSb_3$ based thermoelectric material according to claim 5, comprising a first crystal phase containing the $CoSb_3$ compound and precipitated particles containing the rare earth metal which are precipitated in a crystal grain boundaries of the first crystal phase.

7. The $CoSb_3$ based thermoelectric material according to claim 5 or 6, wherein the rare earth metal Ln is added in the form of LnSb which is an alloy of Ln and Sb.

8. The $CoSb_3$ based thermoelectric material according to claim 5 or 6, wherein the sintered body has a composition of $Co_{1-x}M_xSb_3$ (where x is 0.05 or less) by substituting a part of Co of the $CoSb_3$ compound with any of transition metals M of Fe, Ru and Mn.

9. The $CoSb_3$ based thermoelectric material according to claim 5 or 6, comprising a sintered body of fine powders of the $CoSb_3$ compound mixed with fine powder of the rare earth metal Ln.

10. The $CoSb_3$ based thermoelectric material according to claim 6, comprising the sintered body containing the first crystal phase and a second crystal phase of a composition of $Co_{1-x}M_xSb_3$ (where x is 0.05 or less) by substituting a part of Co of the $CoSb_3$ compound with any of transition metals M of Fe, Ru and Mn.

11. The $CoSb_3$ based thermoelectric material according to claim 10, wherein the sintered body contains the first crystal phase within a range of 60 to 70 wt % and the second crystal phase within a range of 30 to 40 wt %.

12. The $CoSb_3$ based thermoelectric material according to claim 10, comprising a sintered body which is formed of mixed powders containing a first powdery alloy comprising a $CoSb_3$ compound which contains Co and Sb and particles containing a rare earth metal at a content of 0.1 to 1.7 mol % with respect to 100 mol % of the compound, and a secondary powdery alloy of a composition of $Co_{1-x}M_xSb_3$ (where x is 0.05 or less) by substituting a part of Co of the $CoSb_3$ compound with any of transition metals M of Fe, Ru and Mn.

13. The $CoSb_3$ based thermoelectric material according to claim 10, wherein the mixed alloy powders contain 60 to 70 wt % of the first powdery alloy and 30 to 40 wt % of the second powdery alloy.

14. The $CoSb_3$ based thermoelectric material according to claim 13, wherein the mixed alloy powders are prepared by using a planetary ball mill to simultaneously achieve both mixing and finely pulverizing the alloys.

15. The $CoSb_3$ based thermoelectric material according to claims 5, wherein the rare earth metal Ln is at least one selected from La, Ce, Nd, Sm and Gd.

16. A method of producing a $CoSb_3$ based thermoelectric material containing Co and Sb, comprising a step of sintering powder of a compound of $CoSb_3$ to make a sintered body by using spark plasma sintering technique, wherein the powder has 100 μm or less of grain size and the sintered body has 100 μm or less of grain size and 90% or more of relative density.

17. The method according to claim 16, wherein the sintered body has 98% or more of relative density.

18. A method of producing a $CoSb_3$ based thermoelectric material containing Co and Sb, comprising steps of coating powder of a compound of $CoSb_3$ with an oxide film by oxidizing surfaces thereof, pressing the powder to a compact in a desired shape, and sintering the compact.

19. A method of producing a $CoSb_3$ based thermoelectric material containing Co and Sb, comprising steps of coating powder of a compound of $CoSb_3$ with a ceramic layer on surfaces thereof, and sintering the powder of the compound to make a sintered body of higher relative density than 90%.

20. The method according to claim 18 or 19, wherein the powder is sintered by using spark plasma sintering technique.

21. The method according to claim 18 or 19, which method, prior to the coating step, further comprises a step of melting specified quantities of Co, Sb and other predetermined metals into an ingot, homogenizing the ingot for crystallization of the compound of $CoSb_3$, and pulverizing the ingot into the powder.

* * * * *